(12) United States Patent
Wang

(10) Patent No.: US 8,652,947 B2
(45) Date of Patent: Feb. 18, 2014

(54) NON-POLAR III-V NITRIDE SEMICONDUCTOR AND GROWTH METHOD

(76) Inventor: Wang Nang Wang, Bath (GB)

( * ) Notice: Subject to any disclaimer, the term of this patent is extended or adjusted under 35 U.S.C. 154(b) by 394 days.

(21) Appl. No.: 11/861,715

(22) Filed: Sep. 26, 2007

(65) Prior Publication Data

US 2009/0079034 A1   Mar. 26, 2009

(51) Int. Cl.
*H01L 21/20*   (2006.01)

(52) U.S. Cl.
USPC ................................. 438/483; 257/E21.431

(58) Field of Classification Search
USPC .......... 438/459, 479, 481, 483, 492; 257/615, 257/E29.004, E29.089, E29.461, 76, 103, 257/E21.461, E29.086, E21.431
See application file for complete search history.

(56) References Cited

U.S. PATENT DOCUMENTS

| | | | |
|---|---|---|---|
| 6,051,849 A * | 4/2000 | Davis et al. .................... 257/103 |
| 6,121,121 A * | 9/2000 | Koide ........................... 438/481 |
| 6,130,142 A | 10/2000 | Westwater et al. |
| 6,177,688 B1 * | 1/2001 | Linthicum et al. .............. 257/77 |
| 6,261,929 B1 * | 7/2001 | Gehrke et al. ................. 438/478 |
| 6,306,734 B1 | 10/2001 | Givargizov |
| 6,348,096 B1 * | 2/2002 | Sunakawa et al. .............. 117/88 |
| 6,521,514 B1 * | 2/2003 | Gehrke et al. ................. 438/479 |
| 6,545,300 B2 * | 4/2003 | Gehrke et al. ................. 257/190 |
| 6,596,079 B1 | 7/2003 | Vaudo et al. |
| 6,596,377 B1 | 7/2003 | Hersee et al. |
| 6,692,568 B2 | 2/2004 | Cuomo et al. |
| 6,709,513 B2 * | 3/2004 | Fukunaga et al. .............. 117/90 |
| 6,835,246 B2 | 12/2004 | Zaidi |
| 6,844,569 B1 | 1/2005 | Lee et al. |
| 6,897,483 B2 * | 5/2005 | Zheleva et al. ................... 257/77 |
| 6,901,194 B2 * | 5/2005 | Charlton et al. .............. 385/122 |
| 6,958,254 B2 | 10/2005 | Seifert |
| 7,052,979 B2 * | 5/2006 | Nagai et al. .................... 438/478 |
| 7,115,486 B2 * | 10/2006 | Tadatomo et al. ............ 438/481 |
| 7,176,497 B2 * | 2/2007 | Koide .............................. 257/76 |
| 7,361,522 B2 | 4/2008 | Wang et al. |
| 7,521,274 B2 | 4/2009 | Hersee et al. |
| 7,670,933 B1 | 3/2010 | Wang et al. |
| 7,772,595 B2 * | 8/2010 | Guo et al. ........................ 257/79 |

(Continued)

FOREIGN PATENT DOCUMENTS

| EP | 1 246 233 A2 | 10/2002 |
| EP | 1276140 | 1/2003 |

(Continued)

OTHER PUBLICATIONS

Hung et al., "Shell buckling behavior investigation of individual gallium nitride hollow nanocolumn", Applied Physics A, Materials Science & Processing, 2006, vol. A 84, pp. 439-443.

(Continued)

*Primary Examiner* — Daniel Luke
*Assistant Examiner* — Joseph C Nicely
(74) *Attorney, Agent, or Firm* — KPPB LLP

(57) ABSTRACT

A method for growing flat, low defect density, and strain-free thick non-polar III-V nitride materials and devices on any suitable foreign substrates using a fabricated nanocolumns compliant layer with an HVPE growth process is provided. The method uses a combination of dry and wet etching to create nanocolumns consisting of layers of non-polar III nitride material and other insulating materials or materials used to grow the non-polar III-V nitride materials.

19 Claims, 6 Drawing Sheets

(56) References Cited

U.S. PATENT DOCUMENTS

| | | | |
|---|---|---|---|
| 7,850,941 | B2 | 12/2010 | Tsakalakos et al. |
| 8,118,934 | B2* | 2/2012 | Wang .................... 117/94 |
| 2001/0055881 | A1 | 12/2001 | Laermer et al. |
| 2002/0013036 | A1* | 1/2002 | Gehrke et al. ........ 438/462 |
| 2002/0013042 | A1 | 1/2002 | Morkoc |
| 2002/0043208 | A1* | 4/2002 | Biwa et al. ............ 117/94 |
| 2002/0111044 | A1* | 8/2002 | Linthicum et al. .... 438/797 |
| 2003/0006211 | A1* | 1/2003 | Fukunaga et al. ....... 216/2 |
| 2003/0178634 | A1* | 9/2003 | Koide ................... 257/103 |
| 2004/0077156 | A1 | 4/2004 | Tsakalakos et al. |
| 2004/0123796 | A1* | 7/2004 | Nagai et al. .......... 117/103 |
| 2004/0137732 | A1 | 7/2004 | Frayssinet et al. |
| 2004/0157358 | A1* | 8/2004 | Hiramatsu et al. ...... 438/93 |
| 2004/0206299 | A1* | 10/2004 | Tadatomo et al. .... 117/84 |
| 2004/0251519 | A1* | 12/2004 | Sugahara et al. ..... 257/615 |
| 2005/0199886 | A1* | 9/2005 | Yi et al. ................ 257/79 |
| 2006/0091408 | A1 | 5/2006 | Kim et al. |
| 2006/0246722 | A1* | 11/2006 | Speck et al. .......... 438/689 |
| 2006/0270087 | A1* | 11/2006 | Imer et al. ............. 438/46 |
| 2006/0270200 | A1* | 11/2006 | Shibata ................. 438/481 |
| 2006/0270201 | A1* | 11/2006 | Chua et al. ........... 438/481 |
| 2007/0152353 | A1* | 7/2007 | Park .................. 257/E33.001 |
| 2008/0054292 | A1* | 3/2008 | Guo et al. ............. 257/103 |
| 2008/0305568 | A1* | 12/2008 | Huang et al. ........... 438/34 |
| 2009/0079034 | A1 | 3/2009 | Wang |
| 2009/0079035 | A1* | 3/2009 | Wang ................... 257/615 |
| 2009/0174038 | A1* | 7/2009 | Wang ................... 257/618 |
| 2009/0243043 | A1* | 10/2009 | Wang ................... 257/615 |
| 2009/0263925 | A1* | 10/2009 | Kunisato et al. ........ 438/42 |
| 2010/0035416 | A1* | 2/2010 | Chen et al. ........... 438/481 |
| 2010/0075468 | A1* | 3/2010 | Dubrow et al. ....... 438/149 |
| 2010/0140745 | A1* | 6/2010 | Khan et al. ........... 257/615 |
| 2010/0283064 | A1* | 11/2010 | Samuelson et al. ..... 257/88 |
| 2012/0017825 | A1* | 1/2012 | D'Evelyn et al. ...... 117/58 |

FOREIGN PATENT DOCUMENTS

| | | |
|---|---|---|
| EP | 1 422 748 A1 | 5/2004 |
| JP | 2005136106 | 5/2005 |
| WO | 99/19546 | 4/1999 |
| WO | WO 02/44444 A1 | 6/2002 |
| WO | 2006/060599 | 6/2006 |
| WO | WO-2007/107757 | 9/2007 |
| WO | WO-2008/087452 | 7/2008 |
| WO | WO-2008/096168 | 8/2008 |

OTHER PUBLICATIONS

Wagner et al., "Growth and characterization of pendeo-epitaxial GaN (1 1 20) on 4H-SiC(1 1 20) substrates", Journal of Crystal Growth, 2006, vol. 290, pp. 504-512.

International Search Report for International Application PCT/GB2007/001011, completed Jun. 14, 2007, 4 pgs.

International Search Report for International Application PCT/GB2008/050032, Report completed Apr. 23, 2008, 4 pgs.

Search report for Application GB0701069.7, date of search Apr. 24, 2007, 2 pgs.

Search Report for Application GB0708282.9, Date of search Sep. 7, 2007, 2 pgs.

Search Report for Application No. GB0605838.2, date of search Jul. 11, 2006, 1 pg.

Davis et al., "Review of Pendeo-Epitaxial Growth and Characterization of Thin Films of GaN and AlGaN Alloys on 6H-SiC(0001) and Si(111) Substrates", MRS Internet J. Nitride Semicond. Res., 2001, vol. 6, No. 14, pp. 1-12.

Hiramatsu, "Epitaxial lateral overgrowth techniques used in group III nitride epitaxy", Journal of Physics: Condensed Matter, 2001, vol. 13, pp. 6961-6975.

Kim et al., "Growth and characterization of single-crystal GaN nanorods by hydride vapor phase epitaxy", Applied Physics Letters, Sep. 16, 2002, vol. 81, No. 12, pp. 2193-2195.

Kipshidze et al., "Controlled growth of GaN nanaowires by pulsed metalorganic chemical vapor deposition", Applied Physics Letter, 2005, vol. 86, pp. 033104-1-033104-3.

Kusakabe et al., "Overgrowth of GaN layer on GaN nano-columns by RF-molecular beam epitaxy", Journal of Crystal Growth, 2002, vol. 237-239, pp. 988-992.

Mitchell et al., "Mass transport in the epitaxial lateral overgrowth of gallium nitride", Journal of Crystal Growth, 2001, vol. 222, pp. 144-153.

Strittmatter, "Development of Micro-Electromechanical Systems in GaN", Strittmatter Thesis, Jun. 30, 2001, 153 pgs.

Su et al., "Catalytic growth of group III-nitride nanowires and nanostructures by metalorganic chemical vapor deposition", Applied Physics Letters, 2005, vol. 86, pp. 013105l-013105-3.

Yoshizawa et al., "Growth of Self-Organized GaN Nanostructures on $Al_2O_3$(0001) by RF-Radical Source Molecular Beam Epitaxy", Jpn. J. appl. Phys., 1997, vol. 36, pp. L459-L462.

Liliental-Weber, Z et al., "GaN grown in polar and non-polar directions", Opto-Electron. Rev., 12, No. 4, 2004, pp. 339-346.

* cited by examiner a-GaN
a-AlN
substrate a-GaN
a-AlN
substrate a-GaN
a-AlN
substrate

NON-POLAR III-V NITRIDE SEMICONDUCTOR AND GROWTH METHOD

FIELD OF THE INVENTION

The present invention is directed to methods of producing non-polar III nitride materials having both low defects density and low stress, and more particularly to a method utilizing a combination of dry and wet etching to create nanocolumns consisting of layers of non-polar III nitride material and other insulating or materials used to grow the non-polar III-V nitride materials.

BACKGROUND OF THE INVENTION

Wide band-gap III-V nitride materials are recognized to be among the most attractive compound semiconductors for use in a variety of devices. They are suitable for optoelectronic and microelectronic devices that operate in a wide spectral range, from visible to ultraviolet, and in the high temperature/ high power applications area. The main advantage of nitride semiconductors in comparison with other wide-band-gap semiconductors is their low propensity to degrade at high temperature and high power when used for optical and microelectronic devices.

Current commercial nitride semiconductor products are typically based on c-axis polar III-V nitride materials. In c-axis-oriented hexagonal III-V nitride material, the spontaneous and strain-induced piezoelectric polarizations produce strong electric fields that result in band bending of the quantum wells and spatial separation of electrons and holes. Moreover, these properties remain even at the high carrier densities required for laser operation, as has been previously described in the art. (See, e.g., I. H. Brown et al, IEEE J. Quant. Elec. 42 1202, 2006). Consequently, when using these conventional materials the radiative recombination time increases at the expense of quantum efficiency and a red-shift of the emission occurs. Accordingly, non-polar III-Nitride materials, where these polarization fields and the resulting band bending are absent, would open up the possibility of fabricating high efficiency and high power UV-visible light emitters.

Epitaxial lateral overgrowth techniques ("ELOG") and its modifications, such as facet initiated epitaxial lateral overgrowth ("FIELO") and Pendeo (from the Latin to hang or be suspended) are the most widely used approaches employed for suppressing bending and the threading dislocations associated with these materials. Indeed, laterally overgrowing oxide (or metal) strips deposited on initially-grown GaN films have been shown to achieve about two orders of magnitude reduction in dislocation density, reducing it to the $10^7$ cm$^{-2}$ level. However, the low defect-density material only occurs in the wing region, located in the coalescence front, and represents only approximately one fifth of the whole wafer surface area. Large coalescence front tilting and tensile stress are still both present in the overgrowth region. The same ELOG and Pendeo methods could also be used to reduce the defect density in non-polar GaN (on a- or m-plane), although the wing tilt resulting from the different growth rates of the Ga-polar and N-polar wing in these materials introduces further complexity at the coalescence boundaries.

Low defect-density free-standing c-axis polar GaN is currently one of the materials of choice to achieve the desired specification for optoelectronic and microelectronic devices. However, the use of non-polar III nitride materials for semiconductor devices, such as high current density drive light-emitting diodes (LEDs) and laser diodes (LDs), may disrupt the current trend for polar materials. Bulk (melt or sublimation) and hydride vapour phase epitaxy (HVPE) are the two main techniques for growing free-standing and low defect-density c-axis polar and non-polar III nitride semiconductor materials. Bulk GaN growth techniques operating at a very high pressure of ~15 kbar have been successful in growing low dislocation density (<$10^7$ cm-2) material. Unfortunately, this technology suffers from a low growth rate and is limited to small diameter substrates, making these materials very expensive and uneconomic for commercial manufacturing.

HVPE is a reversible equilibrium-based hot-wall process with several advantages, including, high growth rate of up to about 400 µm/hr—more than 100 times faster than that of the metal organic chemical vapour deposition (MOCVD) and molecular beam epitaxy (MBE) methods, low running costs, and lower defect densities in thick GaN as the result of the mutual annihilation of mixed dislocations. However, the HVPE technique still has the same inherent problems as other growth techniques due to its growth on foreign substrates. Therefore, the growth of thick GaN using HVPE in general has to overcome two critical issues, firstly, to reduce the bending and cracking of initial GaN thick films (30-100 µm) on foreign substrates, and secondly, to minimize the defect density of GaN.

To reduce defect density (mainly threading dislocations) and strain, and to improve the surface morphology of the thick GaN films grown by HVPE, various techniques have been employed. For example, ELOG growth under lower reactor pressure and growth with TiN intermediate layers, porous $Si_xN_y$, layers, AlN/GaN superlattices, III nitride semiconductor nanopillars, or deep inverse pyramid etch pits on weakened Si, GaAs and other III-V single crystal wafers have all been used to try and address surface morphology. Various defects reduction methods using defects filter layers, porous interlayers and III nitride semiconductor nanopillars are described in U.S. Pat. Nos. 6,835,246; 6,596,377 and 6,844,569, as well as US Patent Publication Nos. 2004/0157358, 2006/0270201, 2003/0006211, 2002/0111044, 2004/0123796, 2004/0251519 and 2001/0055881. Additional exemplary disclosures may be found in foreign patent publication Nos. JP 2005136106, WO 02/44444, EP 1246233, and EP 1422748, as well as the following non-patent literature R. F. Davis et al, 'Review of Pendeo-Epitaxial Growth and Characterization of Thin Films of GaN and AlGaN Alloys on 6H—SiC(0001) and Si(111) Substrates', MRS Internet J. Nitride Semicond. Res. 6, 14, 1(2001); K. Kusakabe, A. Kikuchi, and K. Kishino, 'Overgrowth of GaN layer on GaN nano-columns by RF-molecular beam epitaxy', J. Crystl. Growth, 237-239, 988 (2002); C. C. Mitchell et al., 'Mass transport in the epitaxial lateral overgrowth of gallium nitride', J. Cryst. Growth., 222, 144 (2001); K. Hiramatsu., 'Epitaxial lateral overgrowth techniques used in III-V nitride epitaxy', J. Phys: Condens, Matter., 13, 6961 (2001) and R. P. Strittmatter, 'Development of micro-electromechnical systems in GaN', PhD Thesis, California Institute of Technology, P. 92 (2003). The disclosure of each of these references is incorporated herein by reference.

However, growth processes using these techniques are tedious, time consuming and expensive. Moreover, the GaN produced using such techniques still has the major disadvantage of being subject to bending and undesired residual strain.

Accordingly, improved methods of producing non-polar III nitride materials having both low defect density and low stress are needed.

SUMMARY OF THE INVENTION

The current invention is directed to method of producing non-polar III nitride materials having both low defect density and low stress.

In one embodiment, the method of the current invention uses a combination of dry and wet etching to create nanocolumns consisting of layers of non-polar III nitride material and other insulating materials or materials used to grow the non-polar III-V nitride materials. In such an embodiment, the nanocolumns may comprise a sacrificial layer of a mechanically weakened structure or less chemically resistant material that can either be one of the layers of non-polar III-V nitride material, the insulating material or the material used to grow the non-polar III-V nitride material.

In another embodiment, the method of the current invention further includes depositing the non-polar III-V nitride material or devices on the nanocolumns by hydride vapour phase epitaxy (HVPE) and MOVPE (or MOCVD) methods.

BRIEF DESCRIPTION OF THE DRAWINGS

Specific embodiments of the invention will now be described with reference to the accompanying drawings, in which.

Figure 1:
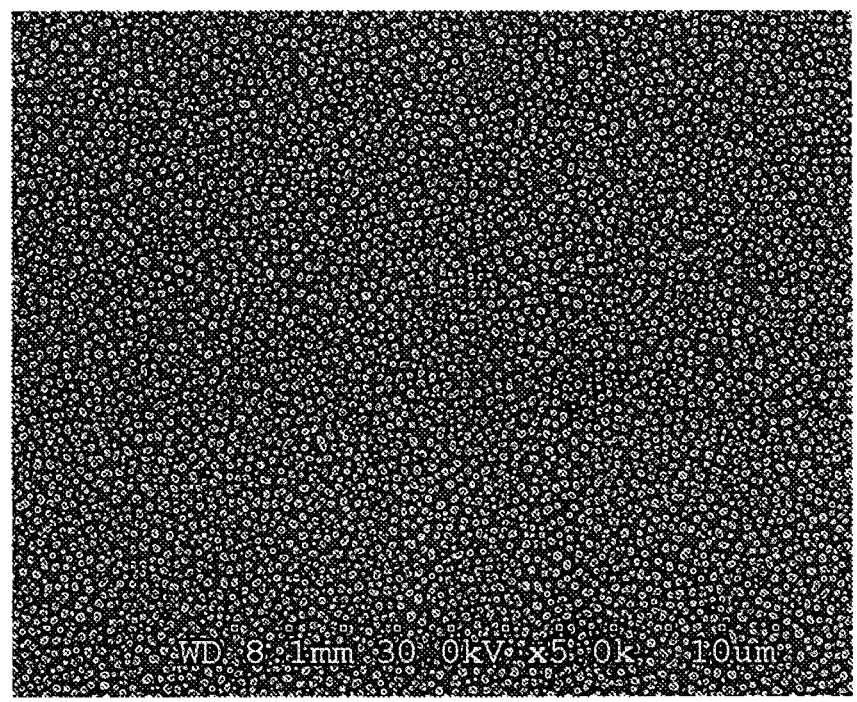
FIG. 1 shows planar view of the annealed high density Ni nanodots.

To illustrate the invention more clearly, the following detailed description and various practical examples using techniques in accordance with the methods of the present invention are described below.

DETAILED DESCRIPTION OF THE INVENTION

The present invention provides a method for growing flat, low defect density, and strain-free thick non-polar III-V nitride materials and devices on any suitable foreign substrates using a fabricated nanocolumns compliant layer with an HVPE growth process. It should be understood that although the application uses the term nanocolumn throughout, the structure may also be referred to as a nano-rod or quantum wire. The use of fabricated nanocolumns comprising non-polar III-V nitride material layers and substrate, for example, as the compliant layer to grow thick non-polar GaN has several advantages.

First, using the method of the current invention the mechanical confinement occurs between the interface of the nanocolumns and top lateral grown layer due to the small diameter and the high aspect ratio of the column (height versus diameter). As a result, the stress and dislocations are mostly localized in the interface among the nanocolumns and the top lateral grown layer. Thus growth leads to the top lateral overgrowth layer being nearly free of stress and dislocations.

In addition, the topography of nanocolumns with a narrow air gap permits coalescence with a very thin overgrown layer. Typically only ~0.2 µm thickness is required for continuous overgrown GaN layers. This narrow air gap will also facilitate the very fast coalescence to form continuous non-polar AlGaN by the epitaxial lateral overgrowth of AGaIN onto these nanocolumns.

With all the advantages described above, high-quality thick non-polar GaN can be grown on this fabricated nanocolumn compliant layer, and has very little tilting in the coalesced front either on top of the nanocolumns or on top of the air gap in comparison with other ELOG or Pendeo processes.

Non-polar GaN wafer bending due to the thermal expansion coefficient difference between the GaN and the substrate is also minimized by a balanced dimension of the nanocolumn and air gap, which functions to decouple and to relax the biaxial strain. Thick and flat non-polar GaN films can therefore be grown using this technique, including so-called non-polar GaN "boules", which may be sufficiently thick to be sliced into multiple wafers.

Localized stress between the nanocolumn and top lateral overgrown layer also allows the thick non-polar GaN to be readily separated from the substrate during the rapid cooling, particularly if a tensile-stressed thin sacrificial layer is included in the fabricated nanocolumn, or is grown on top of the nanocolumns. An anodic electrochemical selective etch process for non-polar p-GaN can also be used to separate the non-polar GaN film from the substrate. The thick non-polar GaN, i.e., a boule, may then undergo slicing, grinding, lapping, and polishing processes as appropriate to produce standard thickness (~350-500 µm) non-polar GaN wafers in a process designed to produce commercial quantities. A non-polar III-V nitride wafer produced in this way may be used as the seed for a further process in accordance with the present invention.

In accordance with the current invention the nanocolumns are fabricated using a template with a non-polar III-V nitride layer, which may be grown by MBE, MOCVD (such as metalorganic vapour phase epitaxy (MOVPE)), HVPE, or any other semiconductor growth methods onto a suitable substrate. Various vapour deposition methods suitable for growing GaN materials are described in U.S. Pat. Nos. 6,413, 627; 5,980,632; 6,673,149; 6,616,757; 4,574,093 and 6,657, 232, the disclosures of which are incorporated herein by reference.

The template can be made of a simple layer, of a heterostructure, or of superlattices consisting of non-polar n- and p-type doped and un-doped III-V nitride materials such as non-polar $In_xGa_yAl_{1-x-y}N$, where $0 \leq x \leq 1$, $0 \leq y \leq 1$, and $0 \leq x+y \leq 1$. The total thickness of the grown non-polar III-V nitride layers in the template is preferably less than 3 µm. The thinner non-polar III-V nitride layers in the template will facilitate the lateral growth with less mass transport for the vertical downward growth. Examples of such templates can be substrate/AlN (~20 nm)/GaN (0.1-2 µm), substrate/AlN (~20 nm)/AlGaN (0.5 µm)/GaN (10-100 nm), substrate/AlN (~20 nm)/AlGaN (0.5 µm)/InGaN (10-100 nm)/GaN (10-100 nm), substrate/GaN/(AlGaN 2.5-10 nm/GaN 2.5-10 nm superlattices), substrate/GaN/(AlGaN 2.5-10 nm/AlN 2.5-10 nm superlattices)/GaN (10-100 nm), substrate/GaN/(InGaN 2.5-10 nm/GaN 2.5-10 nm superlattices)/GaN (10-100 nm), substrate/$Si_3N_4$/AlN (~20 nm)/GaN (1-3 µm)/p-GaN (10-100 nm).

In such embodiments of the invention the dielectric material such as $SiO_2$ or $Si_3N_4$, which can be deposited by sputtering, e-beam evaporation, and plasma-enhanced chemical vapour deposition (PECVD), will serve as the mask, with the replicated pattern from the nanomasks produced by the above-mentioned technologies. The thickness of the dielectric layer depends on the etching selectivity between the dielectric materials and the semiconductor layer(s).

Dry etching of the non-polar III-V nitride layer(s) may be carried out by reactive ion etching (RIE) or inductively coupled plasma etching (ICP) using Ar, $Cl_2$, $BCl_3$, or $H_2$ gas mixtures. The preferred etch depth is to etch down to remove part of the substrate. Further wet etching using different acids and bases allows the fine-tuning of the nanocolumn dimensions.

In situ or ex situ nitridation or oxidation of the nanocolumns can also be performed to reduce the coalescence of the nanocolumns during lateral overgrowth, to consequently maintain the integrity of the nanocolumns for decoupling the thermal expansion difference between the substrate and the lateral overgrown layer.

The fabricated non-polar III-Nitrides nanocolumn templates can be loaded for the initial thin continuous non-polar GaN nano-pendeo growth using MBE, MOCVD or HVPE. The thus-prepared templates can then be loaded for the thick non-polar thick GaN growth using HVPE.

The separation of the grown non-polar GaN can be achieved by the following methods. In brittle materials, such as sapphire and III-V nitrides, cracking may occur easily when the stress exceeds a critical value. The fabricated III-nitrides nanocolumns, with their high aspect ratio and nano-dimensions, will facilitate the cracking mechanism between the substrate and the top thick GaN due to the large difference of the thermal expansion coefficient, particularly when rapid cooling is carried out after the growth. A further mechanical twisting will push the local stress to exceed the critical value to separate the thick film. Another method of separating the non-polar GaN from the substrate is to use anodic electro-chemical etching. In this case, a thin p-GaN layer is deposited at the top of the non-polar III-V nitride layers. Nanocolumns with a p-GaN tip may also be fabricated by an etching process. Using a suitable electrolyte and bias voltage results in p-GaN being selectively etched off leaving the thick top GaN (undoped or n-doped) untouched. Wet chemical etching using $H_3PO_4$ or KOH at high temperature is also very effective in etching off the AlN (especially amorphous AlN), HCl is effective in etching off (100) $LiAlO_2$.

The same growth method described above can also be applied to the growth of other non-polar III-V nitride materials. For example, thick, flat, and low defect non-polar AlN and AlGaN can be grown using $AlCl_3$ precursors formed by passing HCl through Al. Non-polar AlN is very difficult to coalesce under normal ELOG growth technique, but using a nano-column compliant layer with nano-size air-gap in accordance with the present invention will facilitate the very fast coalescence for non-polar AlN and AlGaN.

Although the method in accordance with the current invention has been described generally above, turning to the details of the process in one embodiment the method in accordance with the present invention generally comprises the steps of:
  (a) providing a template material comprising a layer of non-polar III-V nitride semiconductor material;
  (b) creating a mask on top of the template material;
  (c) using the mask to form a plurality of nanocolumns on the template material; and
  (d) growing non-polar III-V nitride semiconductor material onto the nanocolumns.

Regarding step (a), the template material may be selected from the group consisting of non-polar (m-, or a-plane) p-type doped, n-type doped or undoped III-V nitride compounds. The III-V material layer may comprise a simple layer, or multiple layers, a heterostructure, or superlattices of the non-polar III-V nitride compound. The semiconductor layer may comprise one of non-polar $In_xGa_yAl_{1-x-y}N$, where $0 \leq x \leq 1$, $0 \leq y \leq 1$, and $0 \leq x+y \leq 1$. In turn the layer structure template can be made of a simple layer, multiple layers, of the heterostructure, or superlattices consisting of non-polar n- and p-type doped and un-doped semiconductors such as AlxGayIn1-x-y N with $1 \geq x \geq 0$, $1 \geq y \geq 0$. In a preferred embodiment, the template material may comprise a layer of non-polar p-GaN to form a sacrificial layer.

In another preferred embodiment the template material comprises a substrate and the template non-polar III-V nitride material is formed by deposition onto the substrate by epitaxial growth methods. In such an embodiment, the total thickness of the grown non-polar III-V nitride layers is preferably less than 3 μm. Examples of such templates can be substrate/amorphous AlN (~20 to 500 nm)/GaN (50-100 nm), substrate/AlN (~20 nm)/GaN (1-3 μm), substrate/AlN (~20 nm)/AlGaN (1-3 μm)/GaN (10-100 nm), substrate/AlN (~20 nm)/AlGaN (1-3 μm)/InGaN (10-100 nm)/GaN (10-100 nm), substrate/GaN/(AlGaN 2.5-10 nm/GaN 2.5-10 nm superlattices), substrate/GaN/(AlGaN 2.5-10 nm/AlN 2.5-10 nm superlattices)/GaN (10-100 nm), substrate/GaN/(InGaN 2.5-10 nm/GaN 2.5-10 nm superlattices)/GaN (10-100 nm), substrate/$Si_3N_4$/AlN (~20 nm)/GaN (1-3 μm)/p-GaN (10-100 nm).

The substrate may comprise a material selected from the group consisting of r-plane sapphire, m-plane silicon carbide, $LiAlO_2$ (100), non-polar III-V nitride undoped, n-type or p-type materials, or other suitable substrates for non-polar III-V nitride materials growth.

In step (b), the mask or nano-mask may be created using any available mask-making technology, for example one of metal (for example Ni) annealing, anodic porous alumina, e-Beam lithography, interferometry, holography, photolithography or a nano-imprint method. The mask pattern may be random or predetermined, which will depend on the mask fabrication process used, as outlined below, to achieve desired physical or chemical properties. For example, the mask may be created by depositing a layer of dielectric material onto the template material, i.e., either a semiconductor layer or the substrate. The mask may also be formed by imprinting onto the dielectric material using a nano-imprint method. Alternatively, a layer of metal may be applied onto the layer of dielectric material. In this case, the mask may be formed by removing regions of the metal layer.

In step (c), preferably the nanocolumns are formed by etching the template material, which may be made by wet, dry or combined wet and dry etching. The etching may preferably be used to remove part of the substrate. In other words, in such an embodiment the depth of the etching extends below the upper surface of the substrate. After etching, any remaining metal and/or dielectric material on the nanocolumns may be removed. In a preferred embodiment, the method includes subjecting the nanocolumns to a nitridation or oxidation process, which may be either in-situ or ex-situ.

Preferably, each nanocolumn may comprise a sacrificial layer, which may comprise a mechanically weakened structure, high photon absorption material, or less chemically resistant material. The presence of such a sacrificial layer assists in the subsequent separation of an overgrown non-polar III-V nitride material from the substrate using a mechanical separation method, or selective etching off by wet, photochemical or electrochemical means. This sacrificial layer can either be located at one of the layers of non-polar III-V nitride material or at the substrate used to grow the non-polar III-V nitride material. In the example of m-plane nitride grown on (100) LiAlO2 substrate, the LiAlO2 can be readily etched by HCl solution and thinned down to a dimension much smaller that of the top-grown m-plane nitride nanocolumns, to produce a mechanically weakened region. This mechanically weakened LiAlO2 sacrificial layer in the substrate can be used to separate the top grown m-plane non-polar materials from the substrate very easily by rapid cooling or mechanical twisting. In the example of γ-plane Sapphire, the top-grown non-polar a-plane III-V nitride may contain an InGaN layer that will strongly absorb photons of wavelength shorter than 360 nm due to the smaller band-gap. Therefore, laser ablation using a laser of wavelength shorter than 360 nm will be strongly absorbed by this sacrificial layer, resulting in decomposition into In and Ga metal droplets, which can be easily separated from the substrate.

Step (d) may comprise laterally growing an initial layer of non-polar III-V nitride material by nano-pendeo on the nanocolumns, then vertically growing the non-polar III-V nitride material onto the initial layer. The lateral growth of non-polar III-V nitride material may be carried out by a MOCVD, a MBE, or an HVPE method. The lateral growth may comprise combined low temperature (100-500° C.) and high temperature growth processes (700-1400° C.). Alternatively, the lateral growth of non-polar III-V nitride material may be carried out by a pulsed growth method or an integrated pulsed growth and normal growth method. The vertical growth of non-polar III-V nitride material may be carried out by an HVPE method. The non-polar III-V nitride material grown in step d) may be undoped, or n- or p-type doped.

In a preferred embodiment, in step (d), the growth of non-polar III-V nitride material is performed while rotating and maintaining the distance between the surface of the template and gas outlets in a growth chamber.

Although not explicitly set forth above, it should be understood that the non-polar III-V nitride material grown in step d) may comprise a different material from the nanocolumns.

Although not explicitly set forth in the process outline provided above, it should be understood that the method of the current invention may also include the step of forming at least one semiconductor device structure onto the non-polar III-V nitride material grown in step (d). Such a device structure may comprise a light emitting diode (LED), photodetector (PD) or laser diode (LD) for example. In such an embodiment, an n-contact may be deposited on the non-polar n-GaN for subsequently grown semiconductor devices.

Regardless of the specifics of the method, the grown non-polar III-V nitride material may be bonded to a submount with good thermal management property, such as a good thermal conductivity. The non-polar III-V nitride material may then be separated from the substrate through the sacrificial layer of the nanocolumns by rapidly cooling the material, or by mechanical separation, photochemical etching, wet etching, electrochemical etching or laser ablation.

The method may further comprise the step of separating the grown non-polar III-V nitride material, with or without submount, from the nanocolumns. The non-polar III-V nitride material may be separated from the substrate through the sacrificial layer of the nanocolumns by rapidly cooling the material, or by mechanical separation, photochemical etching, wet etching, electrochemical etching or laser ablation. In the case of laser ablation, the laser may be directed toward the substrate-material interface from the side of the substrate. The wet etching, photochemical etching and electrochemical etching can be carried out very effectively because the nanocolumn structure provides a continuously open path for the etching solution or electrolyte to flow into the voids and to make contact with each nanocolumn. This is very different from, for example, the method of using anodic alumina as the direct mask for etching. In that case, closed nano-pores with no connection to the outside are formed, so this configuration makes photochemical etching, wet etching and electrochemical etching very difficult.

In addition, the method may further comprise the step of slicing, grinding, lapping and/or polishing the grown non-polar III-V nitride material to a predetermined thickness. The grown non-polar III-V nitride material may be sliced to produce a non-polar III-V nitride material layer of pre-selected thickness. The non-polar III-V nitride wafer produced in such manner can be used as the seed material for the further growth of thick non-polar III-V nitride material.

Although the above method is described for use in forming non-polar III-V nitride materials and devices using a provided template, it should be understood that the template material may comprise a material previously produced by the method. Likewise, the non-polar III-V nitride semiconductor nanocolumn may be formed by a method according to the first aspect. Finally, a non-polar III-V nitride single-crystal material grown using the method according to the first aspect.

Turning now to the details of step (b), as described above, the mask (also termed a "nano-mask" due to the dimensions involved) can be produced by a metal annealing method, the anodic porous alumina interferometry method, e-Beam lithography, interferometry, holography, photolithography, nano-imprint or any other suitable method. As also described above, the pattern of nanocolumns formed may either by random or pre-determined depending on the process employed. For example, the annealing method would produce a random pattern of nano-structures. Metal annealing nano-mask fabrication processes involve:
   (a) depositing dielectric materials onto the template material, the template material for example comprising a non-polar III-V nitride material layer structure;
   (b) depositing thin metal materials onto the dielectric layer;
   (c) annealing the metal under controlled gas ambient temperature to form high density nano-masks;
   (d) dry and wet etching the dielectric materials using metal nano-masks;
   (e) dry and wet etching the template material using the metal and dielectric nano-masks to form a high density of nanocolumns.

The anodic alumina method may produce both random and determined hexagonal patterns depending on the stress of the processes used, e.g. whether or not a pre-indentation mark is used. Anodic porous alumina nano-mask fabrication processes involve:
   (a) depositing dielectric materials Onto the template material, the template material for example comprising a non-polar III-V nitride material layer structure;
   (b) depositing thin Al onto the dielectric layer;
   (c) anodizing the Al under controlled electrolyte, temperature and voltage to form high density anodic porous alumina nano-masks;
   (d) depositing metal materials on to the alumina nano-masks;
   (e) wet etching to remove the alumina nano-masks;
   (f) dry and wet etching the materials using the metal and dielectric nano-masks to form a high density of nanocolumns.

Finally, photolithography, interferometry and nano-imprinting can also all produce custom patterns. Nano-imprinting can also produce a random pattern if the masks used are based on annealed metals such as Ni. Nano-imprint nano-mask fabrication processes involve:

(a) depositing dielectric materials onto the template material, the template material for example comprising a non-polar III-V nitride material layer structure;
(b) nano-imprinting and developing the nano-holes masks onto the dielectric materials;
(c) depositing thin metal materials onto the nano-holes masks;
(d) removing the nano-imprinted masks to form the periodically aligned metal quantum dots nano-masks;
(e) dry and wet etching the dielectric materials using metal nano-masks;
(g) dry and wet etching the materials using the metal and dielectric nano-masks to form a high density of nanocolumns.

In nano-imprint nano-mask fabrication technology, the "master" mask can be produced by methods such as interferometry, E-beam lithography, sub-micrometer photolithography, or x-ray lithography. The mask pattern can be custom-designed to consist of a photonic crystal structure, high symmetry photonic quasicrystal, gratings, and any other patterns for desired optical effects.

In all of the above embodiments, the substrate may comprise a material selected from the group consisting of r-plane sapphire, m-plane silicon carbide, LiAlO2 (100), or other suitable substrates for non-polar III-V nitride materials growth. In some cases, the template comprises a semiconductor material substrate only, i.e., without any semiconductor layer grown on top of the substrate. In such cases the mask is fabricated directly onto the substrate.

A dielectric material such as $SiO_2$ or $Si_3N_4$, which can be deposited by sputtering, e-beam evaporation or plasma-enhanced chemical vapour deposition (PECVD), may serve as the mask with the replicated pattern from the nano-masks produced by the above-mentioned technologies. The thickness of the dielectric layer depends on the etching selectivity between the dielectric materials and the III-V nitride material layers to be etched.

The nanocolumns thus fabricated may have an aspect ratio (i.e., height versus width) much larger than one, for example more than six. The etching process preferably etches the non-polar III-V nitride material layers off until the desired thickness of the substrate is also etched. Therefore the nanocolumns comprise both the non-polar III-V nitride material and the substrate used to grow non-polar III-V nitride material. The nanocolumns preferably include a sacrificial layer for example of mechanically weakened structure or less chemically resistant material, for example p-GaN.

The sacrificial layer structure is preferably grown in such a way that the lateral growth rate in the bottom and middle parts of the fabricated nanocolumns is much smaller than that of the top part. One example of the layer structure of the nanocolumns comprises layers such as γ-plane Sapphire (0.65 μm)/ AlN (~20 nm)/n-$Al_{0.03}GaN_{0.97}$ (0.35 μm)/p-GaN (80 nm)/n-GaN (100 nm). The lateral growth rate of the GaN along the surface of the nanocolumns is much faster than that of the vertical growth of GaN on the bottom of the AlN, hence preserving the integrity of the voids. In such an embodiment, the p-GaN is also used as the sacrificial layer for the later separation by electrochemical or wet etching.

The dimension of the nanocolumns can be modified by further wet etching. Such treatment allows the fine tuning of the diameter of the nanocolumns for optimized lateral overgrowth and ready separation of such grown thick freestanding non-polar III-V nitride materials from the substrate.

A further ex-situ or in-situ nitridation can prevent the coalescence of the nanocolumns in the root, hence maximizing the decoupling mechanism of the nanocolumns to reduce the defect density and cracks of the top lateral-grown thick layers. One example of the layer structure of the nanocolumns comprises layers such as (100) $LiAlO_2$/amorphous AlN (~50 nm)/n-$Al_{0.06}GaN_{0.94}$ (~10 nm)/n-GaN (100 nm). The nanocolumns may then be fabricated by etching down to expose about 500 nm (100) $LiAlO_2$. Further wet etching using HCl will weaken the (100) $LiAlO_2$ by reducing its diameter. PECVD nitridation process will then be used to deposit $Si_3N_4$ onto the nanocolumns helps to prevent the lateral growth of GaN at the bottom of the nanocolumns. The integrity of the voids between the nanocolumns facilitates the formation of low stress and low defect density top layers during the subsequent lateral epitaxial growth.

EXAMPLES

A general exemplary method in accordance with the invention utilizes HVPE to grow high quality flat and thick non-polar III-V nitride material onto foreign substrates using nanocolumns compliant layers. Such nanocolumns (also known as "nano-rods" or "nano-wires") have substantially constant diameter along the majority of their length. Nanocolumns of non-polar III-V nitride materials can be fabricated on any foreign substrates with the initial non-polar III-V nitride layers grown by MBE, CVD, MOCVD (MOVPE) or HVPE methods. Such nanocolumns may typically have a diameter of about 10 to 300 nm. Further growth of continuous non-polar III-V nitride thick films or wafer can be achieved by epitaxial lateral overgrowth using MOCVD or HVPE. Compound semiconductor thick film and wafer bending due to the lattice mismatch and the thermal expansion coefficient difference between the compound materials and the substrate can be minimized by a balanced dimension of the nanocolumn and air gap, which functions to decouple the impact of the substrate. Thick and flat freestanding non-polar III-V nitride materials can therefore be grown using this technique.

Nano-pendeo lateral overgrowth using these nanocolumns will minimize the defects on the top non-polar III-V nitride thick film through the defects bending mechanism in the interface of nanocolumn and lateral grown layer. The small dimension of the nanocolumns will also minimize the facet tilt in the grain boundary of lateral overgrown layer. The controlled dimension of the nanocolumns and the localized stress between the nanocolumn and lateral-grown layer also allows the thick non-polar III-V nitride material, for example GaN, to be readily separated from the substrate during rapid cooling. An anodic electrochemical selective etch process for non polar p-GaN can also be used to separate the non-polar GaN film from the substrate when the etched nanocolumns include a thin non-polar p-GaN top layer. The thick non-polar GaN may then undergo slicing, grinding, lapping, and polishing processes to produce non-polar III-V nitride wafers. Such produced non-polar GaN can be used as the seed for further growth of thick freestanding non-polar GaN because of the uniform crystal orientation from the centre to the edge of the wafer and low defect density. The method can therefore provide a very economical mass production technology for freestanding non-polar III-V nitride materials.

Although the growth of specific materials will be described below, it should be understood that the growth processes provided by the invention can be applied to the entire family of III-V nitride compounds, generally of the formula $In_xGa_yAl_{1-x-y}N$, where $0 \leq x \leq 1$, $0 \leq y \leq 1$, and $0 \leq x+y \leq 1$. Throughout the following description, the invention is described using GaN as an example of a non-polar epitaxial III-V nitride layer as the material for convenience, though any suitable non-polar III-V nitride material may be used.

Example 1

Figure 2A:
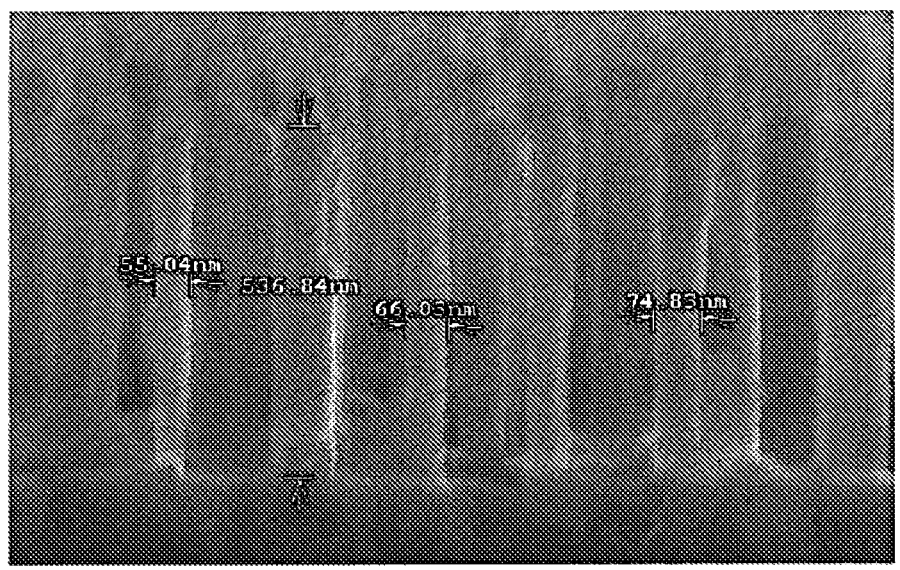
FIG. 2a shows a cross-sectional view of etched nanocolumns consisting of AlN (20 nm), GaN (600 nm), and substrate.
Figure 2B:
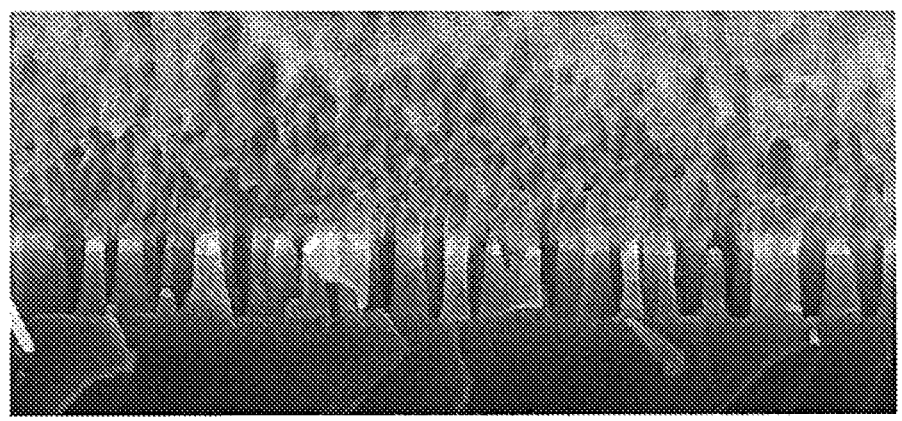
FIG. 2b shows a view of the nanocolumns using different brightness contrast to indicate the layer structure.

A γ-plane-oriented sapphire substrate of about 2 inches (5.08 cm) in diameter with MOCVD-deposited a-plane AlN (20 nm) and GaN of about 0.6 μm is loaded onto the substrate holder of a HVPE vertical reactor. Before loading, the a-plane GaN template is degreased in KOH for a few seconds, rinsed in de-ionized water, etched in a $H_2SO_4/H_3PO_4=3:1$ solution at 80° C. for a few minutes, then rinsed in de-ionized water. It is then necessary to create a mask onto the template. Firstly, a thin dielectric layer of $SiO_2$ or $Si_3N_4$ of ~200 nm is deposited by PECVD onto the GaN template. Then, a thin Ni metal layer of 2-30 nm is deposited by e-beam evaporation or sputtering onto the dielectric layer. Rapid annealing of the metal under $N_2$ gas at an ambient temperature of ~830° C. for about one minute is carried out to form a high density of Ni nano-dots, as shown in FIG. 1, forming the nano-mask. The thickness of the Ni metal allows the control of the density and the dimension of the Ni nano-dots. The next stage is to create the nanocolumns. Reactive ion etching (RIE) using Ar and $CHF_3$ is used to etch the dielectric materials using the Ni nano-dots. Then ICP etching using a gas mixture of Ar, $H_2$, $Cl_2$, or $BCl_3$ is carried out to etch a-plane GaN materials and sapphire substrate using the metal and dielectric nano-mask to form a high density of nanocolumns, as shown in FIG. 2. An aspect ratio (height versus diameter) of more than 6 can be seen on the nanocolumns (FIG. 2a), and the different brightness contrast of FIG. 2b shows clearly the top AlN and GaN layers and the substrate indicating the ratio of the length of the etched substrate versus the III-V nitride being much larger than one.

Residual Ni nano-dots are removed using HCl solution. Residual dielectric materials of $SiO_2$ or $Si_3N_4$ are removed by buffered oxide etch solution and phosphoric acid respectively. Further wet etching using KOH is used to fine tune the dimension of the nanocolumns.

Figure 3A:
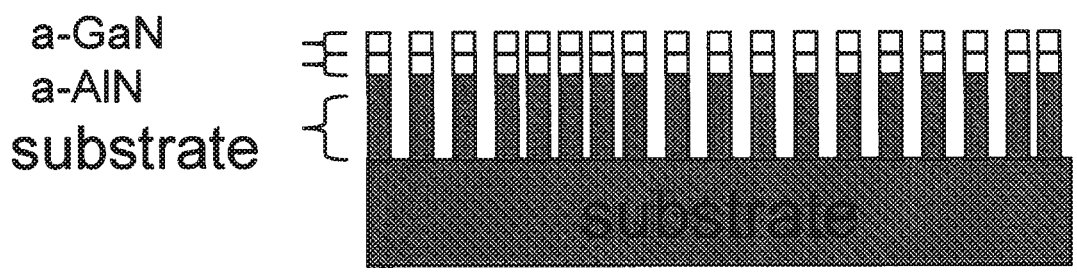
FIGS. 3a-c schematically show the nitridation process on nanocolumns, with FIG. 3a showing etched nanocolumns, FIG. 3b showing full nitiridation and FIG. 3c showing nitride removed from the tip of the nanocolumns exposing the a-GaN.
Figure 3B:
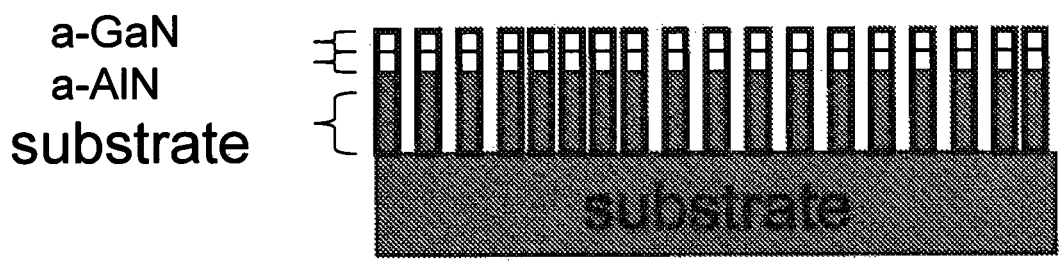
Figure 3C:
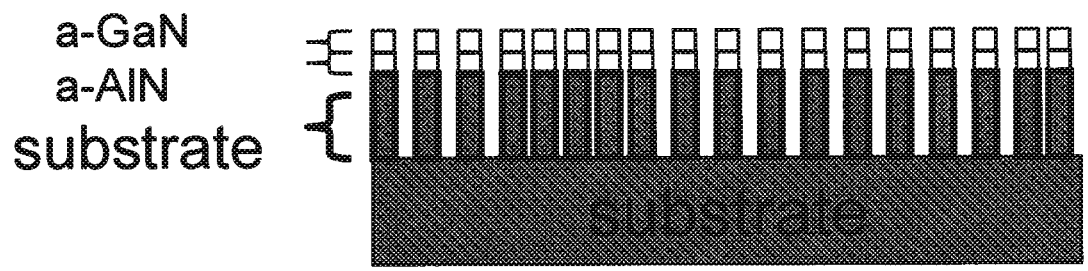

An ex-situ nitridation process is carried out using PECVD with silane and $NH_3$ gas, and shown in FIGS. 3a-c. The nitridated surface has an anti-surfactant effect which inhibits the lateral growth of a-plane GaN. Using nitridation on nanocolumns therefore prevents quick coalescence in the root of the nanocolumns, which would destroy the de-coupling mechanism possible by using nanocolumns. The tip of the nitridated nanocolumns is slightly etched off by RIE, as illustrated by FIG. 3c.

Figure 4:
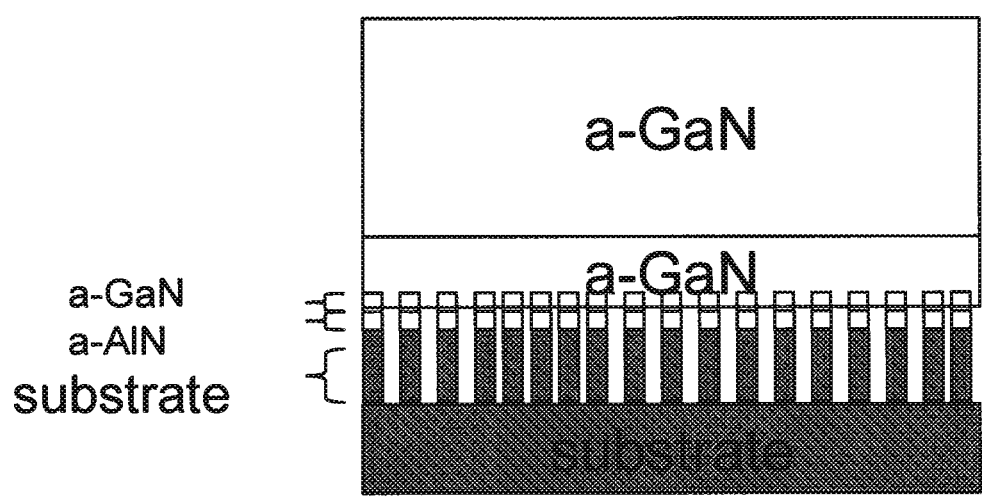
FIG. 4 schematically shows the effect of the initial ELOG and bulk growth processes on a-GaN exposed nanocolumns.

FIG. 4 schematically shows the effect of the initial nano-pendeo and bulk-growth processes on nitridated GaN nanocolumns, in which the initial nano-pendeo and coalescence are carried out using MOVPE, with the bulk over-growth performed using HVPE.

The initial epitaxial lateral overgrowth is carried out by the MOCVD growth process. The nitridated a-plane GaN nanocolumn template is loaded into the reactor. The substrate temperature is then raised to about 1020° C. with the $NH_3$ flow of about 2000 sccm and Trimethylgallium (TMG) flow to about 5 sccm. After about 60 minutes growth, the TMG flow is set to about 10 sccm for about 20 minutes' growth, then to about 20 sccm for about 30 minutes' growth. The continuous a-plane GaN is fully coalesced within about the first 60 minutes.

The nano-pendeo grown a-plane GaN template is then loaded into the HVPE reactor for the bulk a-plane GaN growth. The gas heater is heated to temperature of about 500° C. The pressure of the growth chamber is maintained at about 200 mbar. $N_2$ is introduced through all gas injectors for about 30 minutes to purge the reactor. The nano-pendeo a-plane GaN template is heated to about 350° C. $NH_3$ flow at about 1000 sccm is introduced into the chamber. The GaCl gas precursor is produced by passing about 10% HCl in $N_2$ through a Ga bubbler heated to about 800° C. The conversion rate is nearly 100% for GaCl. Then the template is heated to a temperature of about 1050° C. The pressure of the growth chamber is raised to about 300 mbar. Gas delivery to the growth chamber is set as follows for the growth process: $NH_3$ flow at about 2500 sccm, GaCl flow at about 60 sccm and $N_2$ and $H_2$ to make the rest of the gas. A steady total gas flow of about 3500 sccm is maintained throughout the whole growth process. The growth continues until a GaN epitaxial layer of sufficient thickness is produced. During the growth, the template is rotated to maintain the substantially constant distance between the gas outlets and the surface of the bulk a-plane GaN. For a growth with the V/III ratio set between 10 and 40 in the vertical HVPE reactor, a growth rate of between about 20-160 μm/hour can be achieved. Uniformity of the growth without the aided rotation is better than 2% from edge to edge in a 2 inch (5.08 cm) wafer.

In the nitride growth termination, GaCl gas is switched off, the flow of $NH_3$ is maintained at the same level and $N_2$ flow is increased to make up the steady total gas flow. The substrate cool-down is very fast at the first stage between 1050° C. and 500° C. The flow of $NH_3$ is then switched off below the temperature of 500° C. The cool-down continues with a rate faster than 100° C./min between 500° C. and room temperature. During this time, the gas heater maintains the temperature at about 150° C. and the substrate is lowered down from the chamber to obtain fast cooling-down.

Once the substrate is cooled and removed from the reactor, the γ-sapphire substrate can be seen totally or partially separated from the thick a-plane GaN epitaxial layer. A further mechanical twist is sufficient to separate the partially separated GaN layer.

Example 2

Figure 5:
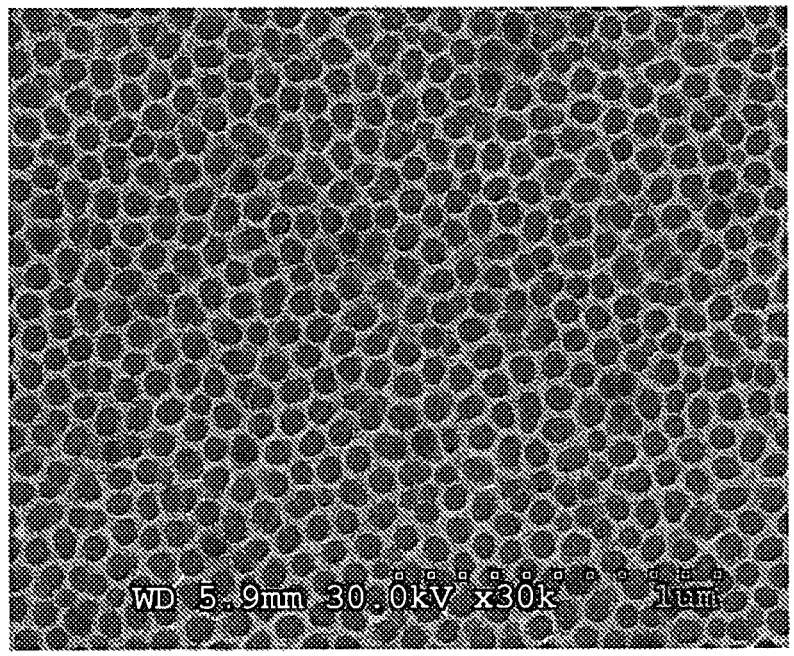
FIG. 5 shows a top view of an anodic porous alumina pattern on top of the III-nitrides template.
Figure 6A:
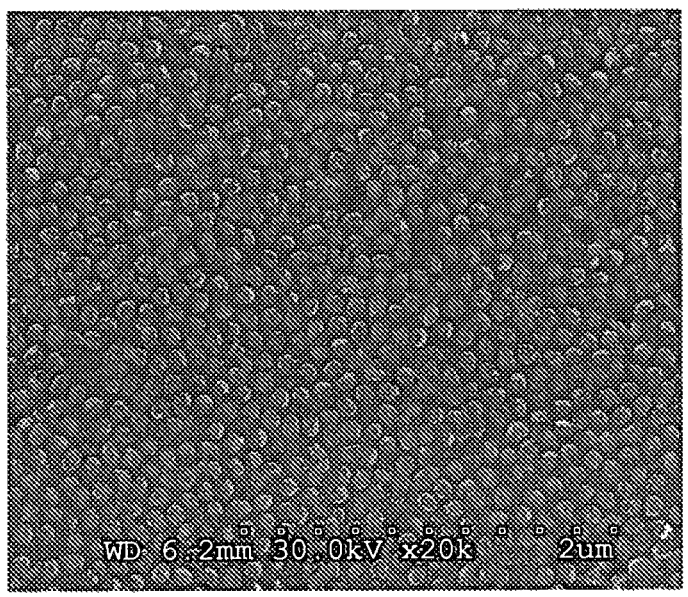
FIGS. 6a and 6b show a top view of Ni quantum dots after etching away an anodic porous alumina pattern on top of the III-nitrides template, with FIG. 6b showing an enlarged SEM photo to show the open channels surrounding the quantum dots.
Figure 6B:
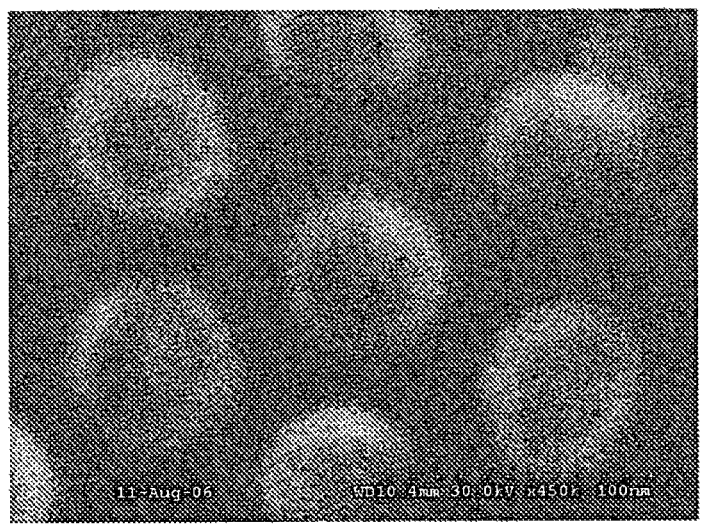

This Example is similar to Example 1, except that here the a-plane GaN nanocolumns are made using anodic porous alumina nano-mask fabrication processes. A γ-plane-oriented sapphire substrate of about 2 inches (5.08 cm) in diameter with MOCVD deposited a-plane AlN (20 nm) and GaN of 0.6 μm is loaded onto the substrate holder of the HVPE vertical reactor. Before loading, the a-plane GaN template is degreased in KOH for a few seconds, rinsed in de-ionized water, etched in a $H_2SO_4/H_3PO_4=3:1$ solution at about 80° C. for a few minutes, then rinsed in de-ionized water. A thin dielectric layer of $SiO_2$ or $Si_3N_4$ of ~200 nm is deposited by PECVD onto the a-plane GaN template. Then a thin Al metal of about 60-200 nm is deposited by e-beam evaporation or sputtering onto the dielectric layer. A two step anodization process is used. A first anodization is conducted under 0.3 M oxalic acid solution at 5° C. with current ~100 mA and 20 V for about 6 hours to form a layer of oxide (alumina) on top of the aluminum layer. The surface texture of the aluminum is changed by the anodization process to produce concavities. Then the oxide is removed by a mixture of about 6 wt % $H_3PO_4$ and 1.8 wt % $H_2CrO_4$ at about 60° C. for 1-1.5 hours. A second anodization is conducted under the same oxalic solution at ~100 mA and 40 V for about 5 hours. The second anodization is required to create a more uniform nano-mask pattern. Trace aluminum may then be removed from the alumina layer. 5 wt % $H_3PO_4$ is used to smooth and enlarge the pores of the anodic porous alumina. FIG. 5 shows an anodic porous alumina pattern on top of the template following the two step anodization process. The dimension for the pores and walls is of 74 nm and 32 nm respectively. Then a thin Ni metal of 4-50 nm is deposited by e-beam evaporation or sputtering onto the pores of the anodic porous alumina. 5 wt % $H_3PO_4$ is then used to remove all alumina. FIG. 6a shows the Ni quantum dots after etching away the anodic porous alumina pattern on top of the a-plane III-nitrides template, shown in more detail in FIG. 6b, an enlarged SEM photo showing the open channels surrounding the quantum dots, which in turn will form the continuous voids surrounding the nanocolumns for enhanced wet etching, photochemical etching and electrochemical etching to separate the top III-V nitride layers from the template.

Reactive ion etching (RIE) using Ar and $CHF_3$ is used to etch the dielectric materials using Ni nano-dots. Then ICP etching using a gas mixture of Ar, $H_2$, $Cl_2$, or $BCl_3$ is carried out to etch a-plane GaN materials as well as the γ-plane sapphire using the metal and dielectric nano-masks to form a high density of nano-columns.

Residual Ni nano-dots are removed using HCl solution. Residual dielectric materials of $SiO_2$ or $Si_3N_4$ are removed by buffered oxide etch solution and phosphoric acid respectively. Further wet etching using KOH may fine tune the dimension of the nanocolumns.

Example 3

Here, the initial MOCVD epitaxial lateral overgrowth process described in Example 1 is replaced by a combined pulsed and normal MOCVD growth method. In this method, the flow sequence of reagent gases is on ($NH_3$ and TMG on) and off (TMG on and $NH_3$ off) in turn for the enhanced lateral growth mode. The time for the on and off period is set to be around 20-60 seconds and 10-15 seconds respectively. The a-plane n-GaN growth step is continued until a continuous a-plane n-GaN epitaxial layer is produced. Then a full non-polar LED device structure is grown on top of the a-plane GaN. Then an Ni (10 nm)/Au (10 nm) contact is deposited and annealed in O2 at 550° C. for about 1 minute. Ti/Al/Ti/Au with Al as the reflector is deposited on top of the Ni/Au contact. The non-polar device is then solder bonded to a submount for good thermal management. The submount may comprise SiC, CVD diamond, AlN, metals, alloys or silicon. The submount is removed from the substrate/template as previously described.

Example 4

In this Example, the thick non-polar m-plane n-GaN is grown on the nanocolumns template, wherein the nanocolumns comprise non-polar m-plane GaN, AlN and (100) $LiAlO_2$. The (100) $LiAlO_2$ is weakened by the further wet etching using diluted HCl. The thick m-plane n-GaN is separated from the substrate through the mechanical cracking of the weakened (100) $LiAlO_2$ nanocolumns.

SUMMARY

It will be apparent to those skilled in the art that a wide range of methods and process parameters can be accommodated within the scope of the invention, not just those explicitly described above. For example, nanocolumns may be fabricated in a variety of ways, which will be apparent to those skilled in the art. The mask for example may be produced using any suitable method, and not just those listed in detail above. The nanocolumns may be fabricated so as to have various shapes of tips, chosen as appropriate for the application in hand. The material of the nanocolumns does not have to be constant, for example the alloy content may be varied along its height so that its properties are most suitable for the specific application. For example, the alloy content may be selected so as to optimise absorption during a laser ablation separation process. Alternatively, a change in the alloy content may optimise the lattice constant for the overgrown semiconductor. Furthermore, the nanocolumn material need not be identical to that of the overgrown compound semiconductor.

In the specific examples described, nanocolumns are fabricated from the non-polar III-V nitride material template before overgrowth of the material. However, use of a nanocolumn layer may permit relatively easy removal of the semiconductor, without causing undue damage to the underlying substrates. The material can then be prepared to be used as the seed for further growth of the material by HVPE. The full benefit of the defects annihilation in HVPE growth can be used to achieve the material with the lowest defect by the use of a previously-grown semiconductor as the seed. In other words, the nanocolumn fabrication processes may need to be done only once, then the semiconductor may be used as a seed for the overgrowth of materials. This would have significant cost savings for the second and each subsequent overgrowth.

In summary, while preferred embodiments of the foregoing invention have been set forth for purposes of illustration, the foregoing description should not be deemed a limitation of the invention herein. Accordingly, various modifications, adaptations and alternatives may occur to one skilled in the art without departing from the spirit and scope of the present invention.

What is claimed is:

1. A method for growing non-polar III-V nitride materials comprising:
   (a) providing a template material comprising a layer of non-polar III-V nitride semiconductor material;
   (b) creating a mask on top of the template material;
   (c) using the mask to form a plurality of independent nanocolumns, comprising non-polar III-V nitride material, in the template material, the nanocolumns each having a diameter between about 10 nm and 300 nm, and each nanocolumn having a tip portion on the distal end thereof, the tip portion being defined by the diameter of the nanocolumn and a length that characterizes a distance that the tip portion spans in a direction parallel with the central axis of the nanocolumn;
   (d) subjecting the nanocolumns to a passivation process wherein a passivation layer is formed on at least one nanocolumn, wherein the passivation layer does not cover at least the tip portion of the nanocolumn; and
   (e) growing a non-polar III-V nitride semiconductor material only onto the tip portion of the nanocolumns, such that the non-polar III-V nitride semiconductor material is not present on other portions of the nanocolumns.

2. The method according to claim 1, wherein the template material comprises a layer of semiconductor material selected from the group consisting of non-polar p-type doped, n-type doped and undoped III-V nitride compounds.

3. The method according to claim 1, wherein the template material comprises a structure selected from the group consisting of a simple layer, multiple layers, a heterostructure, and superlattices of the non-polar III-V nitride semiconductor material.

4. The method according to claim 1, wherein the template material comprises one of non-polar $In_xGa_yAl_{1-x-y}N$, where $0 \leq x \leq 1$, $0 \leq y \leq 1$, and $0 \leq x+y \leq 1$.

5. The method according to claim 1, wherein the template material is formed by deposition onto a substrate by epitaxial growth methods.

6. The method according to claim 1, wherein the template material comprises a substrate comprising a material selected from the group consisting of γ-sapphire, m-silicon carbide, (100) $LiAlO_2$, non-polar III-V nitride undoped, n-type materials, and p-type materials.

7. The method according to claim 1, wherein each nanocolumn comprises a sacrificial layer of non-polar III-V nitride or substrate material.

8. The method according to claim 1, wherein in step (b) the mask is created using a technique selected from the group consisting of metal annealing, anodic porous alumina, e-Beam lithography, interferometry, holography, photolithography and nano-imprinting.

9. The method according to claim 1, wherein a pattern of the mask is one of either random or predetermined.

10. The method according to claim 1, wherein in step (c) the nanocolumns are formed by etching the template material.

11. The method according to claim 10, wherein the template material comprises a substrate comprising a material selected from the group consisting of γ-sapphire, m-silicon carbide, (100) $LiAlO_2$, non-polar III-V nitride undoped, n-type materials, and p-type materials and the etching is used to remove part of the substrate.

12. The method according to claim 10, wherein after etching any remaining metal or dielectric material on the nanocolumns is removed.

13. The method according to claim 1, wherein the passivation process is one of: a nitridation process and an oxidation process.

14. The method according to claim 1, wherein step (e) comprises laterally overgrowing an initial layer of non-polar III-V nitride material and then vertically growing the material onto the initial layer.

15. The method according to claim 14, wherein the laterally overgrown and vertical grown non-polar III-V nitride material comprises a material different from that used to form the nanocolumns.

16. The method according to claim 1, further comprising including forming a semiconductor device structure onto the non-polar III-V nitride material grown in step (e).

17. The method according to claim 1, further comprising separating the grown non-polar III-V nitride material from the nanocolumns by a method selected from the group consisting of rapidly cooling the material, mechanical separation, wet etching, electrochemical etching and laser ablation.

18. The method according to claim 1, further comprising processing the grown non-polar III-V nitride material to a predetermined thickness by at least one method selected from the group consisting of slicing, grinding, lapping and polishing.

19. The method according to claim 1, wherein the template material comprises a non-polar III-V nitride material previously produced by a method comprising the steps of:
(a) providing a first template material comprising a layer of non-polar III-V nitride semiconductor material;
(b) creating a second mask on top of the first template material;
(c) using the second mask to form a plurality of nanocolumns in the template material; and
(d) growing a non-polar III-V nitride semiconductor material to form the template material onto the nanocolumns.

* * * * *